(12) United States Patent
Behfar et al.

(10) Patent No.: US 6,792,025 B1
(45) Date of Patent: Sep. 14, 2004

(54) WAVELENGTH SELECTABLE DEVICE

(75) Inventors: Alex Behfar, Ithaca, NY (US); Alfred T. Schremer, Jr., Ithaca, NY (US); Cristian B. Stagarescu, Ithaca, NY (US)

(73) Assignee: BinOptics Corporation, Ithaca, NY (US)

(*) Notice: Subject to any disclaimer, the term of this patent is extended or adjusted under 35 U.S.C. 154(b) by 25 days.

(21) Appl. No.: 10/226,076

(22) Filed: Aug. 23, 2002

(51) Int. Cl.[7] .............................................. H01S 3/083
(52) U.S. Cl. ......................................... 372/94; 372/93
(58) Field of Search ............................. 372/93, 94, 97

(56) References Cited

U.S. PATENT DOCUMENTS

| | | | | |
|---|---|---|---|---|
| 3,811,774 A | * | 5/1974 | Honeycutt et al. | 356/5.09 |
| 4,851,368 A | | 7/1989 | Behfar-Rad | |
| 4,924,476 A | | 5/1990 | Behfar-Rad | |
| 5,031,190 A | * | 7/1991 | Behfar-Rad | 372/94 |
| 5,132,983 A | * | 7/1992 | Behfar-Rad | 372/94 |
| 5,764,681 A | | 6/1998 | Ballantyne | |
| 6,498,799 B1 | * | 12/2002 | Shevy et al. | 372/6 |

OTHER PUBLICATIONS

Behfar–Rad, A., Wong, S.S.; Monolithic AlGaAs–GaAs Single Quantum–Well Ridge Lasers Fabricated with Dry–Etched Facets and Ridges; IEEE Journal of Quantum Electronics, vol. 28, No. 5, May 1992.

Behfar–Rad, A., Ballantyne, J.M., Wong, S.S.; AlGaAs–based triangular–shaped ring ridge lasers; Appl. Phys. Lett. 60 (14) Apr. 1992.

* cited by examiner

*Primary Examiner*—Don Wong
*Assistant Examiner*—Leith Al-Nazer
(74) *Attorney, Agent, or Firm*—Jones, Tullar & Cooper, PC

(57) ABSTRACT

An integrated semiconductor laser device capable of emitting light of selected wavelengths includes multiple ring lasers of different cavity lengths coupled in series or in parallel to a common output to produce an output beam having a wavelength corresponding to the selected ring lasers.

38 Claims, 6 Drawing Sheets

WAVELENGTH SELECTABLE DEVICE

BACKGROUND OF THE INVENTION

The present invention relates, in general, to a method and apparatus for providing a wavelength selectable device, and more particularly to an integrated laser device having multiple lasers of different cavity lengths and/or different active layer bandgaps, selectively activated and coupled to an output to produce an output beam having a wavelength corresponding to the cavity length and/or to the active layer bandgap of the selected laser. The laser cavity is defined through the etching of its mirror facets.

Advances in current monolithic integration technology have allowed lasers of complicated geometry to be fabricated, including ring lasers with a variety of cavity configurations. These developments expand the prospective applications for integrated semiconductor lasers and add the attractiveness greater manufacturability and reduced cost. This technology has opened the opportunity to explore new and novel features that can be combined with integrated semiconductor laser devices, both inside and outside the laser cavity.

A ring cavity laser possesses benefits that a Fabry Perot cavity does not provide; for example, a ring cavity will produce lasing action with higher spectral purity than can be obtained with a Fabry Perot cavity. Such a ring cavity is illustrated by the monolithic triangular ring laser described in U.S. Pat. No. 4,851,368, the disclosure of which is hereby incorporated herein by reference. The coupling of ring lasers to form optical logic circuits has been described in U.S. Pat. No. 5,132,983 and in U.S. patent application Ser. No. 09/918,544 entitled "Curved Waveguide Ring Lasers," the disclosures of which are hereby incorporated herein by reference. Unidirectional behavior in ring lasers has been described in U.S. Pat. No. 5,132,983, in U.S. Pat. No. 5,764,681 and also in U.S. patent application Ser. No. 09/918,548 entitled "Unidirectional Curved Ring Lasers", the disclosures of which are hereby incorporated herein by reference.

Over the past few years, thanks mainly to the popularity of the Internet, the demand for bandwidth in optical communication systems has experienced explosive growth. Carrier companies and their suppliers have addressed this demand by installing Wavelength Division Multiplexing (WDM) systems that allow multiple wavelengths of light to be transmitted through a single strand of optical fiber. However, this, in turn, has given rise to a demand for many different lasers, each emitting light of a specific wavelength. As a result, the carrier companies have had to stock many lasers, each with a different output wavelength, and this has created a tremendous inventory problem for them.

SUMMARY OF THE INVENTION

A laser source capable of emitting multiple wavelengths in accordance with the present invention would address the foregoing problem, and, in addition, could be used in Wave Division Multiplexing (WDM) systems as a spare device that could operate at one of the multiple wavelengths. Furthermore, a wavelength selectable device that could be set remotely to emit one of its selectable wavelengths would allow a provider of service to light up an unused wavelength or reprovision a wavelength without needing a service call. This would lower provisioning costs tremendously for a service provider.

A wavelength selectable device would also be desirable in an application such as wavelength routing, in which the inexpensive generation of multiple wavelengths would allow widespread deployment of such devices in data communications. One example of using such routing of traffic is in Passive Optical Networks (PONs), where no active elements are present in the path of the signal between the source and the destination.

Briefly, the present invention is directed to an integrated semiconductor laser device that is capable of selectively emitting several wavelengths. The device includes multiple ring lasers of different cavity lengths selectively activated and coupled to an output to produce an output beam having a wavelength corresponding to the cavity length of the selected ring laser. Alternatively, or in conjunction with the foregoing device, ring lasers with different active layer bandgaps are selectively activated to emit different wavelengths.

In a first embodiment of the invention, different cavity length ring lasers and/or different active layer bandgap ring lasers are coupled in series, or in cascade, the ring lasers each preferably being unidirectional. The lasers are of different cavity lengths and/or of different active layer bandgaps so that each laser emits light at a different wavelength, and they are positioned so that the output light beam emitted from a first laser is coupled into the input of the next laser. The combined lasers produce a wavelength selectable device that is able to emit light of a wavelength corresponding to a selected one of the cascaded ring lasers. The active laser is chosen by biasing it above its threshold, while the remaining different length lasers are biased below threshold and the different active layer bandgap lasers remain unbiased. The ring lasers that are not biased above threshold are transparent to the light emitted by the selected ring laser so the light produced by the selected laser is propagated from the selected device, through any intervening lasers, to the device output.

In a second embodiment of the invention, a semiconductor optical amplifier (SOA) element is provided at the device output. The SOA element is switched between an above-zero bias and a reverse bias to modulate light emitted by any of the ring lasers and inserted into the SOA element. This SOA element absorbs the received light under reverse bias and allows the light to pass through without loss, or amplifies the light, under positive bias. The reason for operating the SOA element in this way is to provide a high-speed modulation capability at the wavelength selectable device output. The SOA receives the inserted light, optionally amplifies it, passes it unchanged, or absorbs it, and provides a modulated output at the wavelength of the activated laser. Alternatively, an electroabsorption (EA) element can be substituted instead of the SOA element and the modulation performed through the application of zero to reverse bias on the EA element. The utility of the integrated structure of the invention is in its ability to produce a laser light output beam of a predetermined wavelength at a predetermined location, and to modulate the output beam, if desired.

In a third embodiment of the invention, multiple ring lasers, preferably of the unidirectional kind, are each connected to a common, multi-legged output cavity either directly or through an intermediate SOA. In this way, multiple lasers can be simultaneously activated and, if desired, each laser's output can be modulated before it enters the multi-legged output cavity, which may also be a SOA. This integrated device is used in applications where more than a single wavelength is desired, such as in Wavelength Division Multiplexing (WDM). Alternatively, an EA element can be substituted for the intermediate SOA element and the modulation performed through the application of zero to reverse bias on the EA element.

The multi-legged output cavity of the foregoing embodiment provides a single output beam; however, in another embodiment, the output cavity has multiple output points for greater fan-out applications. This embodiment can be used for applications desiring multiple output beams, and couples one or more wavelengths before the beam is emitted from the device.

BRIEF DESCRIPTION OF THE DRAWINGS

The foregoing, and additional objects, features and advantages of the present invention will be apparent to those of skill in the art from the following detailed description of preferred embodiments thereof, taking in conjunction with the accompanying drawings, in which.

DESCRIPTION OF PREFERRED EMBODIMENTS

Figure 1:
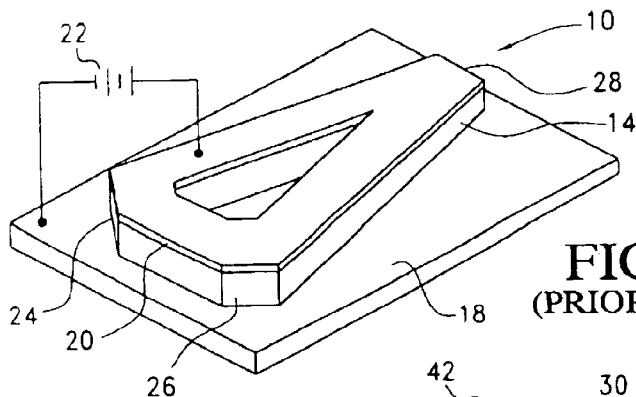
FIGS. 1 and 2 illustrate prior art ring-type lasers.
Figure 2:
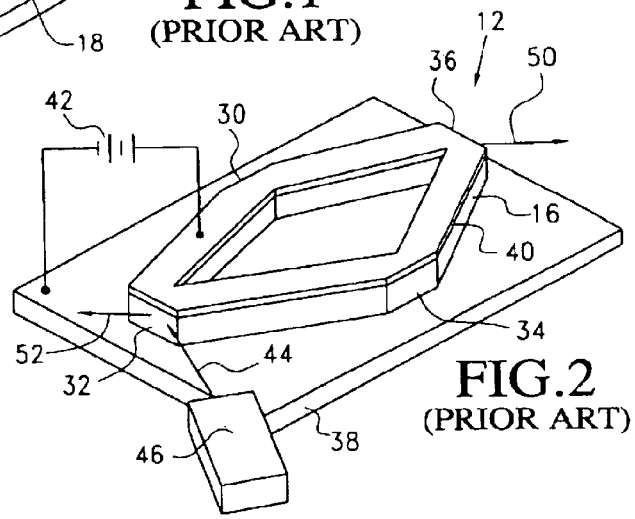

Turning now to a more detailed description of the present invention, FIGS. 1 and 2 illustrate at 10 and 12, respectively, known semiconductor ring lasers produced on a substrate through an etching process which permits greater control of facet surfaces than is possible with cleaving techniques or with previous etching processes. These devices are described and illustrated in detail in U.S. Pat. No. 4,851,368 and in U.S. Pat. No. 5,132,938, respectively. In both cases, the semiconductor laser structures are designed so that traveling waves propagated within the laser cavities 14 and 16, respectively, strike the facets at predetermined angles to control the amount of light emitted at respective emergent facets. In the device of FIG. 1, a triangular cavity 14 is formed as a monolithic structure on a substrate 18, with the upper surface of the laser being coated with a metal layer 20 to permit application of a bias voltage 22. Application of a suitable bias voltage causes lasing action in the cavity, creating optical traveling waves which propagate within the cavity and which are reflected by angled facets 24, 26 and 28. The surfaces of these facets are optically smooth with facets 24 and 26 providing total internal reflection and facet 28 providing partial transmission to permit emergence of light. Light striking surface 28 at an angle greater than the critical angle will be totally reflected and light impinging on the surface at an angle less than the critical angle is emitted, as is described in the aforesaid U.S. Pat. No. 4,851,368.

Ring cavity 12, illustrated in FIG. 2 and described in greater detail in U.S. Pat. No. 5,132,983, includes four cavity leg sections intersecting at facets 30, 32, 34 and 36 to form a diamond shape. As before, the laser is fabricated on a substrate 38 and includes a top layer 40 which is electrically conductive and to which a bias voltage 42 may be connected to control the lasing of the device. In this laser, the facets 30 and 34 are both totally internally reflective, and by properly designing the angles of the four legs, the facets 32 and 36 will receive circulating light at less than the critical angle so that light can be emitted from each facet. Although light produced by the laser 12 may propagate in both the clockwise and counterclockwise directions within the cavity 16, propagation can be restricted to a single direction, for example through the use of injection-locking, where a laser light beam 44 from a suitable source 46 may be injected into cavity 16, as by way of facet 32. The percentage of incident light which is coupled into the laser will be dependent on the angle of incidence of beam 44 with respect to the surface of facet 32, and in the illustrated embodiment, beam 44 produces a clockwise propagation of light, resulting in a corresponding exit beam 50 at facet 36. This light may also be emitted as beam 52 from facet 32. The amount of light that is coupled into the laser from source 46 depends upon the angle of incidence of beam 44 and the spacing between source 46 and facet 32.

Figure 3:
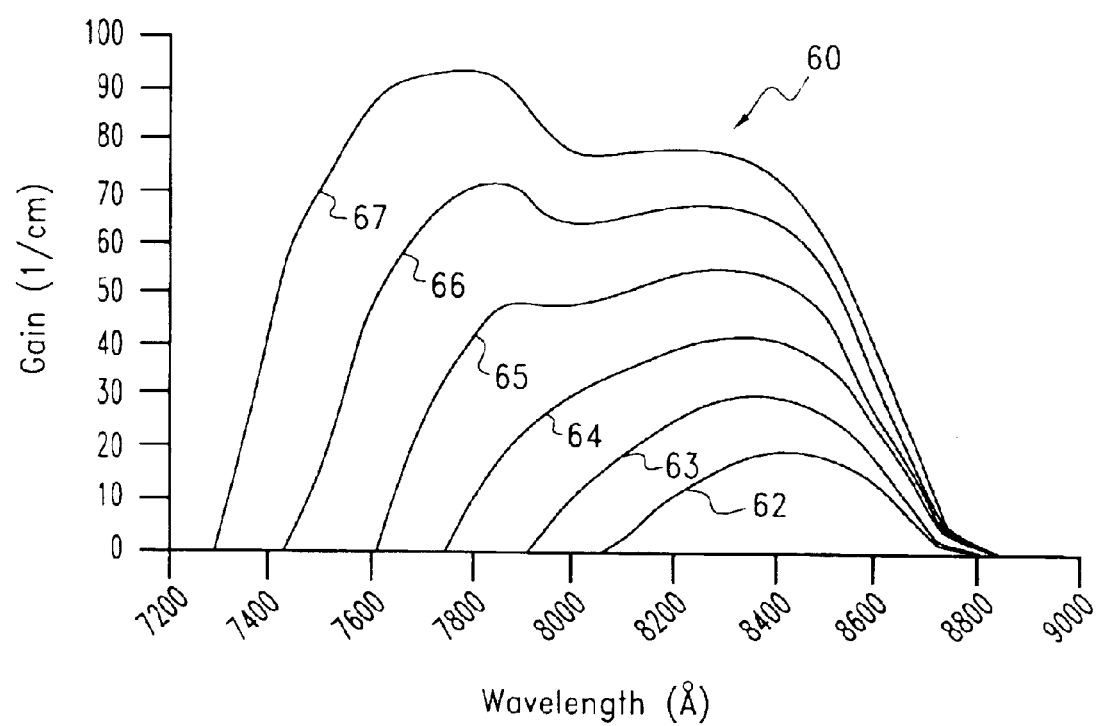
FIG. 3 illustrates the gain profile as a function of wavelength for a quantum well in a laser device for various pump current densities.

The material from which the lasers are constructed is a semiconductor laser structure with at least one quantum well, although other types of structures such as Double Heterostructure (DH) or quantum dot, that are known to those skilled in the art, could also be used. FIG. 3 is a graph which illustrates that the gain of a quantum well-based material increases as the current density pumping the quantum well is increased. It also illustrates that the peak of the gain profile for a particular wavelength in a quantum well material shifts to shorter wavelengths as the threshold current density pumping the quantum well increases. This behavior has been explained by, for example, Mittelstein et al in Applied Physics Letters, Vol. 54, pps. 1092–1094. In addition, Behfar-Rad et al, in Applied Physics Letters, Vol. 54, pps. 493–495, describe how the threshold current density for quantum well lasers increases as the cavity length is reduced. Thus, a shorter cavity length laser experiences a higher round-trip loss than does a longer cavity length having equivalent facets. To compensate for this higher loss, the cavity needs to generate higher gain for the laser to reach threshold. Therefore, the threshold current density for producing lasing is higher for a shorter length laser than for a longer one.

Figure 4:
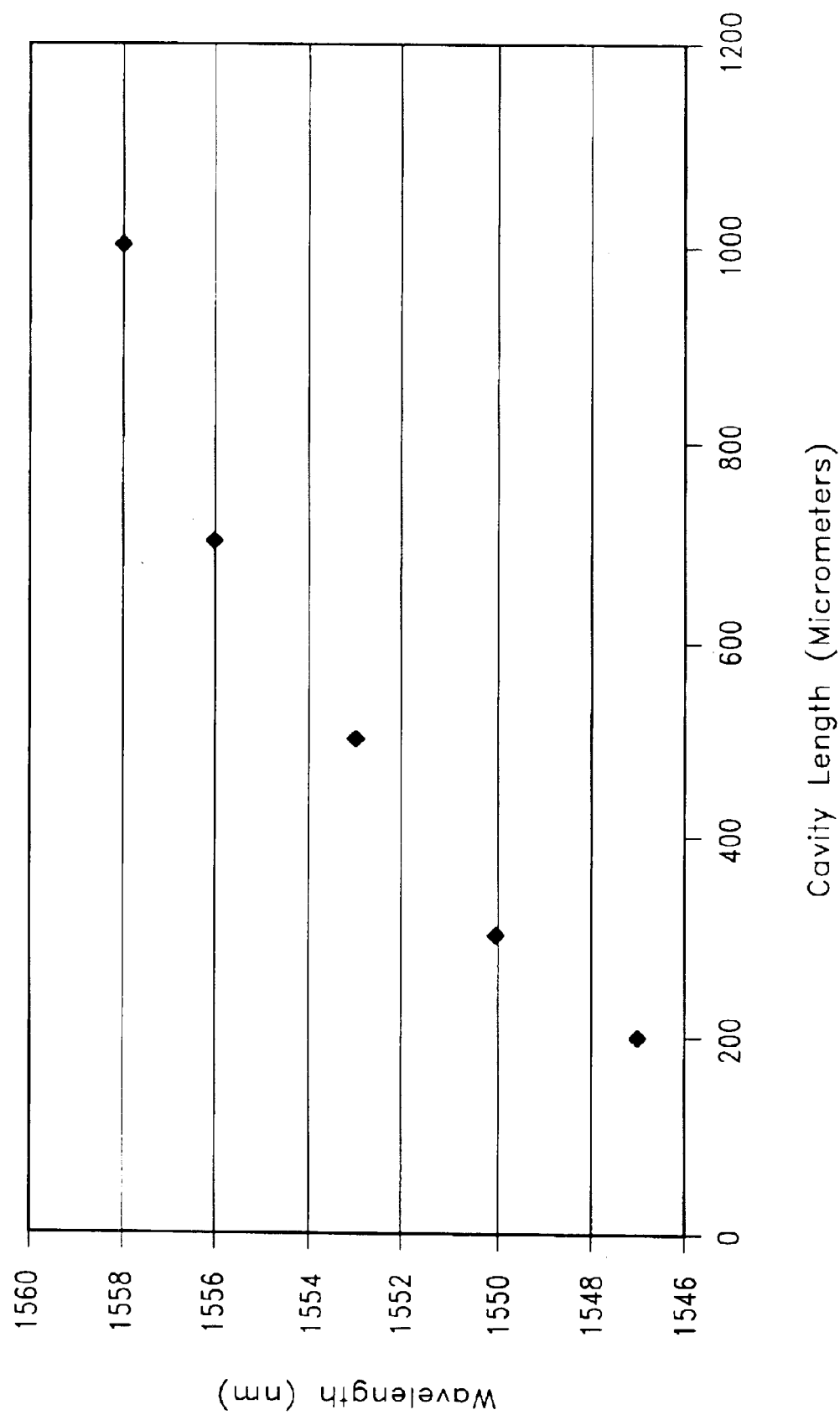
FIG. 4 illustrates the behavior of peak lasing wavelength as a function of the cavity length of ring-shaped quantum well lasers.

FIG. 4 illustrates how the peak lasing wavelength shifts to lower (shorter) values as the ring cavity length is reduced; therefore, the shorter the cavity, the shorter the wavelength. This is explained by the fact that shorter laser cavities have higher threshold current densities from the fact that, as illustrated in FIG. 3, the peak gain shifts to shorter wavelengths as higher current densities pump the quantum well.

Accordingly, the output wavelengths of a laser is controllable by selecting the length of the laser cavity. This feature is used in the present invention to construct devices having output beams which are capable of being switched between multiple wavelengths, and which may then be amplified or otherwise modulated. Alternatively, or in addition to changing the cavity length, shorter wavelength laser emission can be obtained by increasing the bandgap in the active layer, this feature also being used in the present invention to construct devices emitting multiple wavelengths.

Figure 5A:
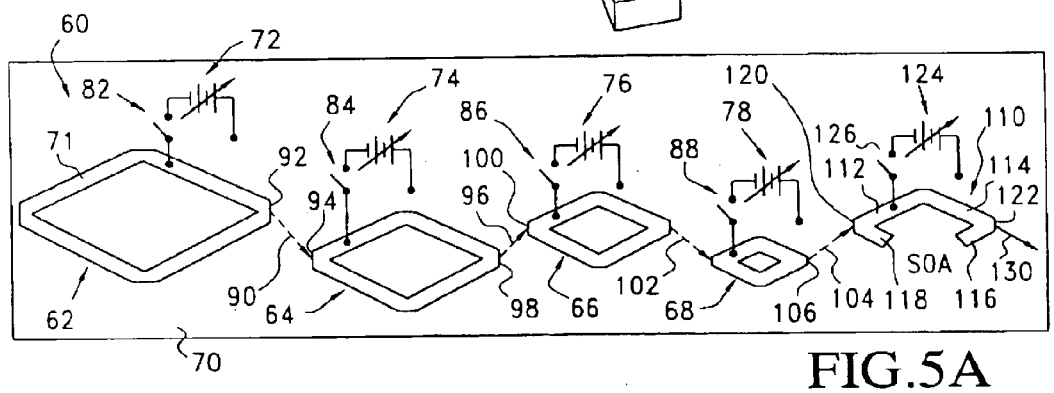
FIG. 5A is a diagrammatic top plan view of a first embodiment of a wavelength selectable laser device in accordance with the invention, incorporating a series of cascaded, directly coupled ring lasers, each laser having a different cavity length, the series of ring lasers terminating in an output SOA.

A wavelength-selectable laser device 60 may be fabricated utilizing the features described above by combining multiple lasers interconnected in series, as illustrated generally in FIG. 5A. In this device, a plurality of ridge-type lasers such as the diamond-shaped lasers illustrated in FIG. 2, are arranged in series, as illustrated by the lasers 62, 64, 66 and 68 fabricated integrally on a substrate 70. The top surface of each laser, such as the top surface 71 of laser 62, includes an electrode such as the electrode 40 in FIG. 2, to which is connected a corresponding bias voltage source such as the sources 72, 74 76 and 78, respectively. The bias voltages applied to the several lasers may be individually variable, and preferably are connected through suitable switches such as the switches generally indicated at 82, 84, 86 and 88, respectively, for selectively energizing the corresponding lasers. As illustrated, the cavity length; that is, the distance propagated light travels through the laser, is different for each laser. For example, in one embodiment, the laser 62 may be fabricated with a cavity length which, when energized by bias source 72, will emit light at a wavelength corresponding to a cavity length of 700 $\mu$m, laser 64 when energized, will emit light at a wavelength corresponding to a cavity length of 500 $\mu$m, laser 66, when energized, will emit light at a wavelength corresponding to a cavity length of 400 $\mu$m, and laser 68, when energized, will emit light at a wavelength corresponding to a cavity length of 320 $\mu$m. It will be understood that this is simply an example of the wavelengths that may be generated by each of these lasers, and that other wavelengths may be produced by varying the cavity lengths of the respective lasers. Similarly, although four lasers are illustrated in this embodiment, this is for purposes of illustration; it will be understood that additional lasers, or fewer lasers, may be used in a series arrangement in accordance with the invention.

The ring lasers are preferably unidirectional and are positioned in series so that the output beam emitted from a first laser device is coupled into the next adjacent device in the series. Thus, for example, laser 62 is positioned with respect to laser 64 so that an output beam 90 from output facet 92 of laser 62 is directed onto an input facet 94 of laser 64. By positioning the lasers 62 and 64 close together and at a location so that the beam 90 strikes facet 94 at an angle of incidence that will enable the beam to be coupled into laser 64, the beam 90 is inserted into laser 64. In similar manner, laser 64 is positioned with respect to laser 66 so that an output beam 96 emitted from output facet 98 of laser 64 will impinge on input facet 100 of laser 66 at an angle of incidence that will enable the beam 98 to be inserted into laser 66. Again, an output beam 102 emitted by laser 66 will be inserted into laser 68, and an output beam 104 will be emitted from output facet 106 of laser 68, which, in the illustrated embodiment, is the last laser in the series.

Each of the lasers 62, 64, 66 and 68 may be selectively energized by applying a bias of a selected value that is above its lasing threshold or below its lasing threshold. When biased above threshold, the corresponding laser will be energized to produce an output beam of light at its operating wavelength, while a laser biased below threshold will not operate as a laser, but preferably will be energized sufficiently to overcome losses in the cavity so that the cavity will be effectively transparent to an injected light beam to allow that beam to pass through it without appreciable loss. Thus, for example, if it is desired to operate the device 60 to produce an output beam 104 having a wavelength corresponding to a cavity length of 500 $\mu$m, laser 62 would be switched off, laser 64 would be switched on and biased above threshold to emit a light beam 96 having a wavelength corresponding to a cavity length of 500 $\mu$m. Lasers 66 and 68 would then be energized below threshold to be transparent to the output from laser 64, so that laser 66 would produce an output beam 102 also having a wavelength corresponding to a cavity length of 500 $\mu$m and laser 68 would be biased to be transparent to that beam to produce at its output facet 106 an emitted beam 104 at the selected wavelength corresponding to a cavity length 500 $\mu$m. In another example, if an output beam 104 having a wavelength corresponding to a cavity length of 700 $\mu$m is needed, laser device 62 would be energized above threshold to produce an output beam 90, which has a wavelength corresponding to a cavity length of 700 $\mu$m, and laser devices 64, 66 and 68 would be energized below threshold to become transparent to beam 90.

Alternatively, or in addition to the different cavity length lasers described above, ring lasers of different active layer bandgaps can be used to generate the different wavelength emissions needed for device 60. The preferred coupling of such lasers is that the shorter wavelength emitting lasers, corresponding to the larger active layer bandgaps, receive light from longer wavelength emitting lasers. The shorter wavelength lasers will be substantially transparent to the longer wavelengths without bias.

In one embodiment of the invention illustrated in FIG. 5A, the output facet from each laser device was spaced about 2 $\mu$m from the input facet of the next adjacent laser device in the series so that each laser device was directly coupled to the next adjacent laser device with very little loss.

The selective wavelength device 60 of FIG. 5A may incorporate a semiconductor optical amplifier (SOA) element 110 for modulating the output beam 104. The ring lasers described above operate with feedback so that they are not effective amplifiers; when the bias exceeds threshold, these lasers start to lase. However, the SOA element 110 is an open ring so that feedback is eliminated and it can be strongly biased to produce amplification of an input wavelength without lasing. Thus, for example, the SOA element may include four legs 112, 114, 116 and 118, with an input facet 120 at the junction of legs 118 and 112, and an output facet 122 at the junction of legs 114 and 116. However, legs 116 and 118 are truncated so that the ring is open. A variable bias source 124 is connected through a switch 126 to an electrode on the top surface of the SOA element for selective energization. When energized by the bias source 124, the SOA element 110 receives and amplifies the output beam 104 from laser 68 and emits an amplified output beam 130.

Although the SOA element is normally biased to amplify the inserted light beam 104, alternatively it can be switched between an above-zero bias and a reverse bias to modulate the inserted light. The SOA element absorbs the light under reverse bias, and allows the light to pass through without loss or with amplification under positive bias, thereby providing a high speed light modulation capability. Accordingly, the combined device 60 of FIG. 5A may be operated to select a desired output wavelength and to amplify and/or modulate the output light beam, as desired.

Figure 5B:
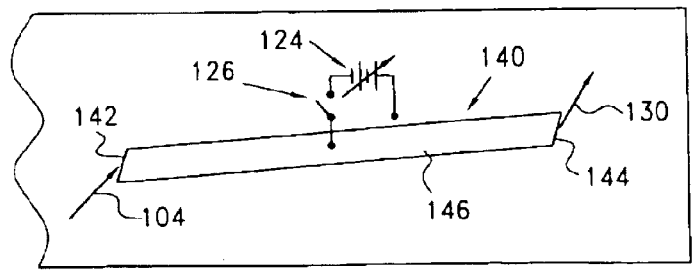
FIG. 5B illustrates a modified SOA for the device of FIG. 5A.

The SOA element 110 may be replaced by a straight SOA 140 illustrated in FIG. 5B having an input facet 142 and an output facet 144 at the two ends of a leg 146. Preferably, the leg 146 is angled away from the horizontal at the angle of incidence of the ring laser in order to maximize coupling of the output beam 104 to SOA 140. When energized by the bias source 124, the SOA element 140 amplifies the output beam 104 from laser 68 and emits an amplified output beam 130.

One disadvantage of using an SOA as a modulator is that it is not transparent at zero bias; the applied bias needs to be positive to achieve transparency, so that each input photon essentially produces an equivalent output photon. This can result in relatively high levels of electric current for operating the selective wavelength devices illustrated hereinabove. This current can be reduced by providing an output electroabsorption (EA) modulator having a quantum well bandgap which is larger than the energy corresponding to the lasing wavelength of the lasers so that it would be transparent at zero bias. Such a larger quantum well band gap can be provided through various fabrication techniques, such as epitaxial regrowth or through the use of impurity-free diffusion such as that described in "Effects of $In_{0.53}Ga_{0.47}As$ cap layer and stoichiometry of dielectric capping layers on impurity-free vacancy disordering of $In_{0.53}Ga_{0.47}As/InP$ multiquantum well structures" by Yu et al, Journal of Applied Physics, Vol. 88, pps. 5720–5723. Either the SOA element 110 of FIG. 5A or the SOA element 140 of FIG. 5B may be replaced by an EA element that would modulate the light 104 by being switched between zero and reverse bias. This EA element would have to be built from material with having an active layer bandgap greater than that of the bandgap corresponding to the shortest wavelength for beam 104.

Figure 6:
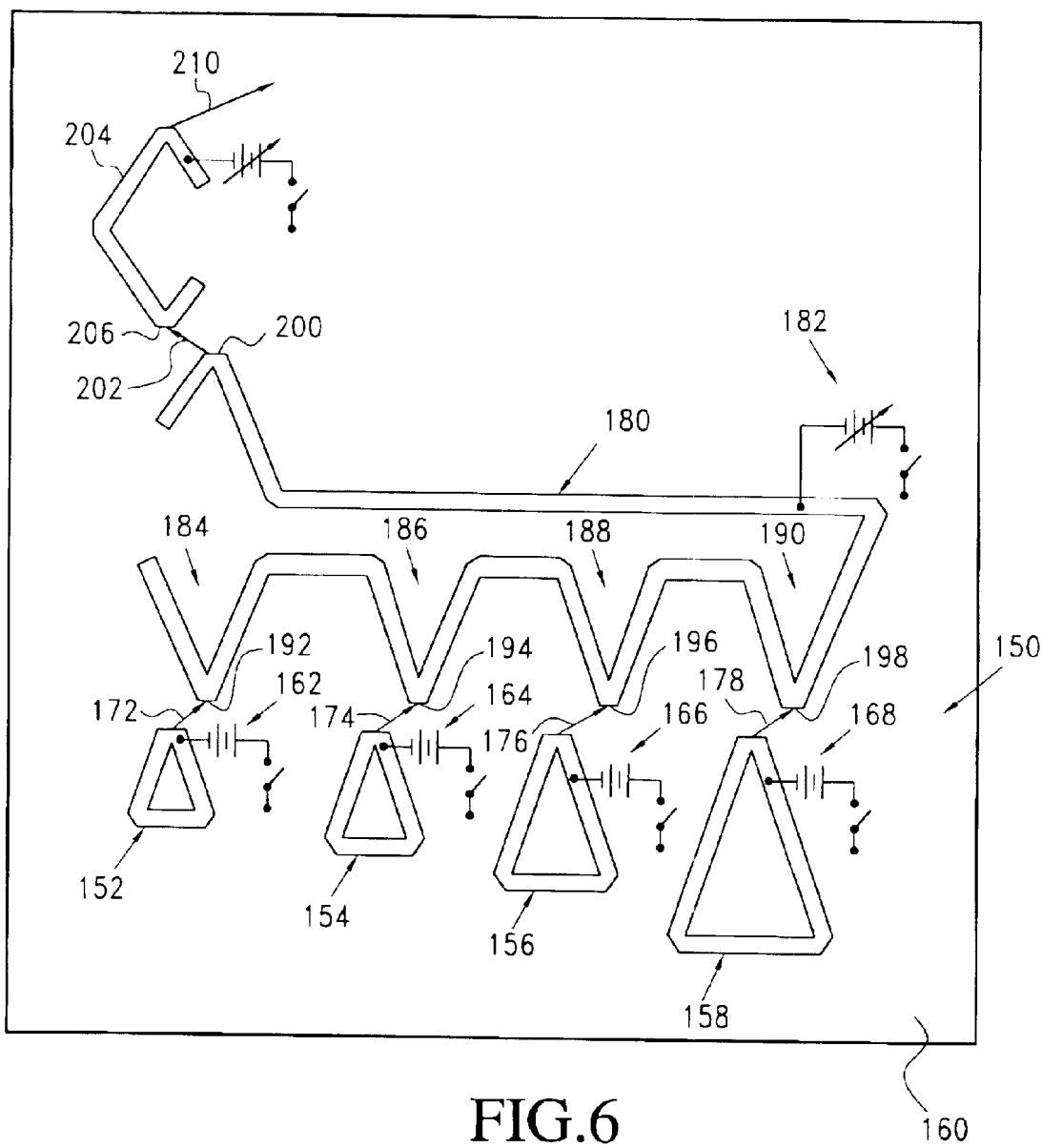
FIG. 6 is a diagrammatic illustration of a second embodiment of a wavelength selectable laser device incorporating a plurality of different cavity length ring lasers directly coupled in parallel to a multi-legged SOA providing a single output.

An alternative to the series arrangement of laser devices illustrated in FIG. 5A is the parallel arrangement 150 of selectively energizable lasers generally indicated in FIG. 6. In this embodiment, multiple ring lasers 152, 154, 156 and 158 are provided, with each laser having a different cavity length, and, therefore, emitting a different wavelength of light, as described above. As before, the ring lasers preferably are unidirectional, and are integrally fabricated on a common substrate 160. Each laser is selectively actuated by a corresponding switched bias source, indicated generally at 162, 164, 166 and 168, respectively. When energized above threshold, each laser emits a corresponding output beam 172, 174, 176 and 178, respectively, with each output beam having a wavelength which corresponds to the cavity length of its corresponding laser. Alternatively, or in addition to the different cavity length, ring lasers of different active layer bandgaps can be used to generate different wavelength emissions.

In the embodiment of FIG. 6, the output beams from all of the lasers are inserted in parallel into a common semiconductor optical amplifier 180 which is energizable by a corresponding variable switched bias source 182. The SOA 180 in this embodiment has multiple input legs 184, 186, 188 and 190, each of which incorporates an input facet, such as the input facets 192, 194, 196 and 198, respectively. The SOA 180 is an open ring element which may be biased to amplify the light beams inserted at any of the input facets and to propagate the input beam to an output facet 200 where an output beam 202 is emitted. In operation, any one or more of the lasers 152, 154, 156 and 158 may be activated by applying a bias current above its threshold to produce a corresponding output beam at the wavelength which corresponds to the cavity length of the activated device. The SOA 180 receives that light at its corresponding input facet, amplifies it, and emits it at the output facet 200, with the output 202 having the wavelength of the activated laser. If multiple lasers are activated, the output beam 202 will include multiple wavelengths.

Although the ridge lasers 152, 154, 156 and 158 are illustrated as being triangular, it will be understood that other ring laser configurations can be used. For example, the four legged diamond shaped laser of FIG. 2 may be used, curved leg lasers or multi-legged laser devices in a variety of configurations may be utilized if desired.

If desired, the output beam 202 from SOA 180 may be inserted into a second SOA modulator 204, by way of inlet facet 206. SOA element 204 may operate in the manner described above with respect to element 110 in FIG. 5A to modulate beam 202 to produce a modulated output beam 210 having a wavelength corresponding to the wavelength or wavelengths of the selected laser input or inputs. The integrated structure 150 illustrated in FIG. 6 enables the production of an output laser beam 210 having a preselected wavelength and modulated as desired by the output SOA 204. Alternatively, the SOA 204 may be replaced by a straight SOA or by an EA element, as discussed above for the device of FIG. 5A.

Figure 7:
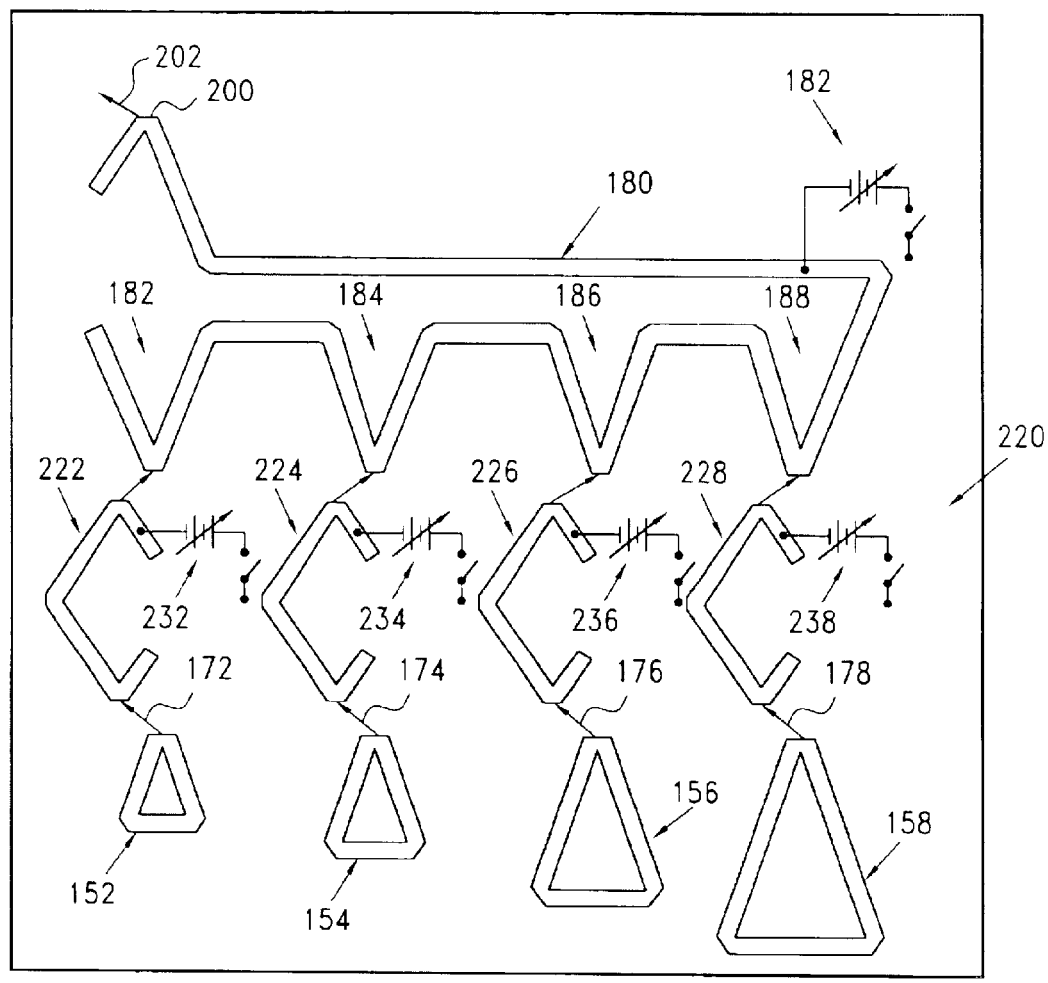
FIG. 7 is a diagrammatic illustration of a third embodiment of the invention, incorporating a plurality of different cavity length ring lasers coupled through corresponding SOA elements to corresponding legs of a multi-legged SOA with a single output.

Another embodiment of the invention is illustrated in FIG. 7, wherein a selectable wavelength device generally indicated at 220 is similar to device 150 of FIG. 6, but instead of a direct connection between the lasers and the SOA 180, individual SOA elements are included between the lasers 152, 154, 156 and 158 and the common SOA element 180 to provide individual modulation or amplification of the laser outputs. In this embodiment, elements common to the embodiment of FIG. 6 are similarly numbered. As illustrated, the output beams 172, 174, 176 and 178 from the respective lasers 152, 154, 156 and 158 are directed into corresponding SOA elements 222, 224, 226 and 228, with each of these elements being energizable by corresponding switched variable bias sources 232, 234, 236 and 238, respectively. The SOA elements may be energized to amplify or to modulate the beams inserted by the respective laser devices to produce corresponding output beams which are inserted into respective input facets of the input legs 182, 184, 186 and 188 of the SOA element 180. The assembly illustrated in FIG. 7 thereby provides multiple lasers which can be selectively or simultaneously activated, wherein each laser output can be modulated individually before it is inserted into the multilegged common output SOA element 180. This integrated device may be used in applications where more than a single wavelength is desired in the output beam 202, and such a device is particularly useful in wavelength division multiplexing (WDM). Alternatively, the SOA elements 222, 224, 226 and 228 may be replaced by straight SOA elements or by EA elements, as discussed above with respect to FIG. 5A.

Although the input lasers 152, 154, 156 and 158 are illustrated as being triangular ring lasers, it will be understood that other types of ring lasers may be utilized, and, if desired, a series connection of lasers may be used for each input to the respective SOA elements, 222, 224, 226 and 228, to provide additional wavelength selectivity.

Figure 8:
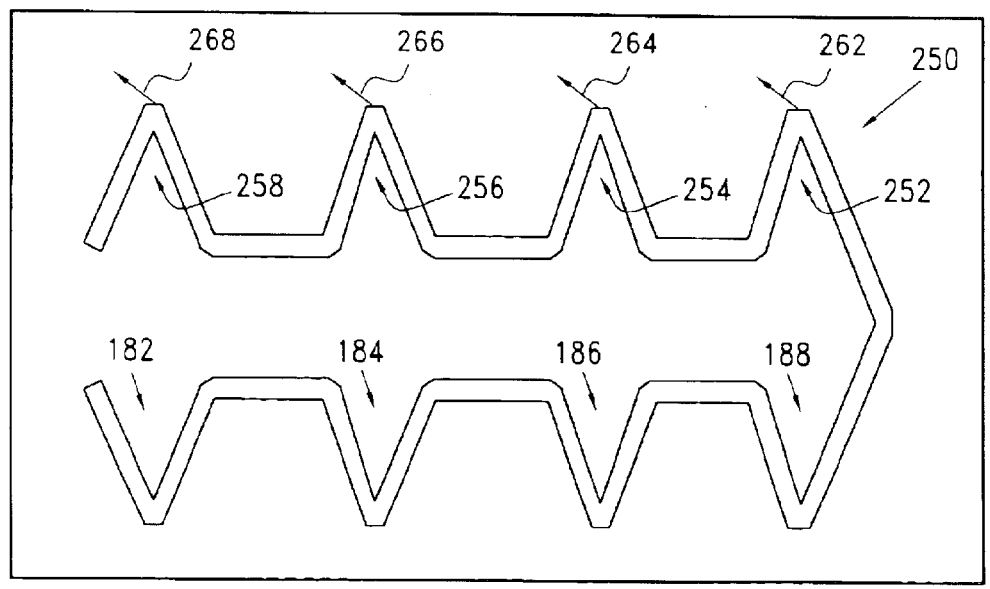
FIG. 8 is a diagrammatic illustration of a multilegged SOA with multiple outputs usable in the devices of FIGS. 6 or 7.

The multilegged SOA element 180 illustrated in FIGS. 6 and 7 provides a single output at its output facet 200. If desired, however, the SOA element may be modified, as illustrated in FIG. 8 at 250, to incorporate multiple output legs 252, 254, 256 and 258. An output facet is provided at each of the output legs, so that the device emits output beams at each facet, as illustrated at 262, 264, 266 and 268.

Figure 9:
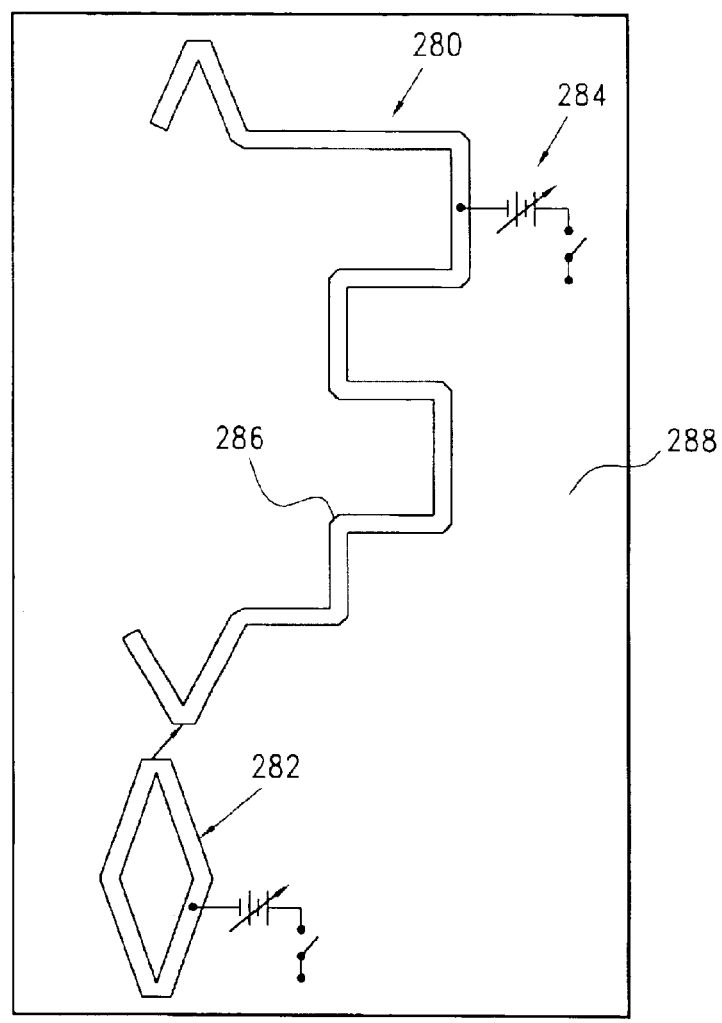
FIG. 9 is a diagrammatic illustration of an alternative light modulator.

FIG. 9 illustrates in top plan view a ridge type semiconductor EA modulator 280 which has been fabricated using quantum well material with a larger band gap than the energy corresponding to the emission wavelength of an input laser device 282. This EA modulator 280 has transparency at zero bias; however, it becomes absorbing when it is reverse biased by a suitable switched bias source 284. Since this modulator only needs to operate between zero and reverse bias, very little current flows through it. As a result, during the fabrication process metal on the device is minimized to reduce capacitance so that it can operate at very high speed. The modulator at 280 illustrated in this figure incorporates right-angled facets, such as the facet 286, so that the path length can be increased without occupying excessive area on the substrate 288 on which it is fabricated.

Figure 10:
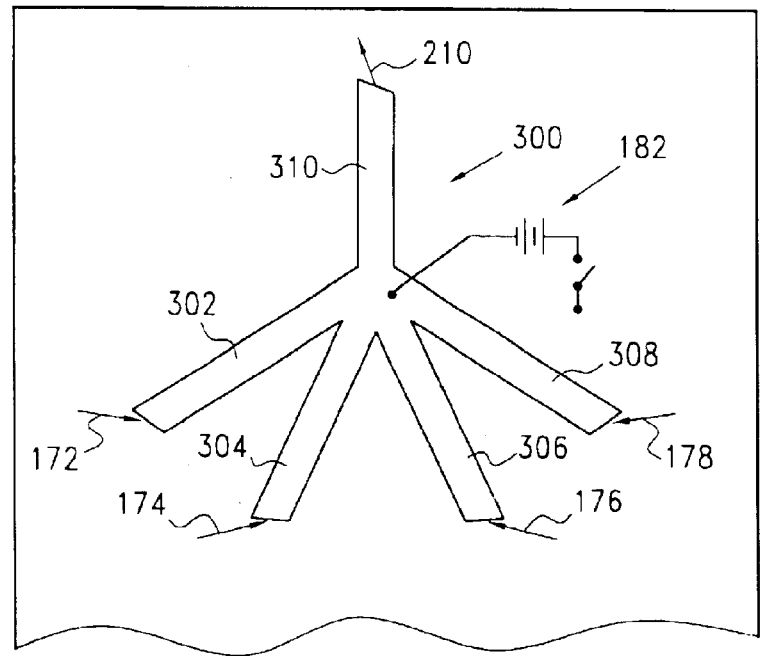
FIG. 10 is a diagrammatic illustration of an alternative light coupler.

One disadvantage of using multi-legged couplers such as coupler 180 of FIG. 6 is that they emit unwanted light at facets 194, 196, and 198. FIG. 10 illustrates an alternative SOA coupler 300 that avoids this unwanted emission by efficiently combining beams 172, 174, 176 and 178 into a common output element. In this embodiment, the coupler includes input legs 302, 304, 306 and 308 which receive in parallel the respective beams 172, 174, 176 and 178. These beams merge into a common output leg 310, from which output beam 210 is emitted from the output facet of coupler 300. Switched bias source 182 controls the operation of this coupler, as described above.

Although coupling of light has been achieved in the devices of FIGS. 6, 7, or 8 by SOA 180 or 250, and in the device of FIG. 10 by SOA coupler 300, it is desirable, in certain cases where SOA amplification is not required, to replace these SOA elements with EA elements as described above. This would allow the EA elements to operate as couplers even without a bias, or to operate as modulators in addition to being couplers.

Although the present invention has been illustrated in terms of preferred embodiments, it will be understood that a variety of ridge laser configurations may be utilized without departing from the true spirit and scope of the present invention, as set out in the following claims.

What is claimed is:

1. A wavelength selectable device comprising:
a first semiconductor ring cavity laser having a first output facet, and being energizable to emit at said first output facet a first output beam having a first wavelength;
a second semiconductor ring cavity laser having an input facet and a second output facet, and being energizable to emit at said second output facet a second output beam having a second wavelength;
said second laser being substantially transparent to said first wavelength and being coupled in series with said first laser to receive said first output beam at said second cavity input facet and to emit said first output beam at said second output facet when said first laser is energized.

2. The device of claim 1, further including means for selectively energizing one of said first and second lasers to cause a selected one of said first and second output beams to be emitted at said second cavity output facet.

3. The device of claim 1, further including multiple ring cavity lasers, including said first and second ring lasers, each laser having an input facet, an output facet and a distinct cavity length and each being energizable to produce at its output facet an output beam having a distinct wavelength corresponding to its cavity length, said lasers being directly coupled in series, each laser being substantially transparent to the output beams of preceding lasers in the series.

4. The device of claim 3, wherein each laser in said series is independently and selectably energizable to produce an output beam having a wavelength corresponding to its cavity length, the output beams from each energized laser being injected into the input facet of the next laser coupled in series and being emitted at the output facet of the last laser coupled in said series.

5. The device of claim 3, wherein said lasers are ridge-type lasers, and further including a bias source connectable to each laser for selectively energizing said lasers.

6. The device of claim 5, wherein each of said lasers is unidirectional.

7. The device of claim 3, further including a bias source for each laser connectable to selectively supply a bias voltage above the lasing threshold to produce a corresponding output beam or below the lasing threshold to prevent operation as a laser but to cause the laser to be transparent to an injected light beam.

8. The device of claim 7, further including a modulator coupled to the output of the last laser coupled in said series.

9. The device of claim 1, further including a modulator coupled to said output facet of said second laser.

10. The device of claim 9, wherein said modulator is a semiconductor optical amplifier.

11. The device of claim 10, wherein said lasers and said modulator are integrally fabricated on a single semiconductor substrate.

12. The device of claim 9, wherein said first and second laser devices and said modulator are quantum well devices, and wherein said modulator quantum well has a higher bandgap than the bandgaps of said first and second lasers.

13. The device of claim 9, wherein said modulator is an electroabsorption modulator.

14. The device of claim 1, wherein each of said first and second lasers has a different cavity length, and when energized produces a wavelength corresponding to its cavity length.

15. The device of claim 1, wherein each of said first and second lasers has a different active layer bandgap and when energized produces a wavelength corresponding to its bandgap.

16. The device of claim 1, further including additional lasers coupled in series to said first and second lasers, each laser in said series being energizable to produce an output beam having a corresponding distinct wavelength, being transparent to the output beams of preceding lasers, being directly coupled to at least one next adjacent laser and being selectively energizable to produce at an output of the series of lasers one or more output beams each corresponding to a respective energized laser.

17. The device of claim 1, further including multiple ring cavity lasers, including said first and second ring lasers, each laser having an input facet and an output facet and each having a different active layer bandgap and being energizable to generate at its output facet an output having a distinct wavelength corresponding to its bandgap, said multiple lasers being directly coupled in series, each laser being substantially transparent to the output beams of preceding lasers in the series.

18. The device of claim 17, further including an open ring semiconductor optical amplifier, directly coupled to the output facet of the last laser coupled in said series.

19. The device of claim 18, further including a variable bias source coupled to energize said open ring for amplifying or modulating light emitted by said second ring cavity laser.

20. A wavelength selectable device, comprising:
- a plurality of semiconductor lasers each having a laser ring cavity with a corresponding output facet, and each being independently activatable to emit light of a corresponding different wavelength;
- a plurality of variable bias sources, each bias source being connected to a corresponding laser and selectively operable to activate its corresponding laser to emit light of its corresponding wavelength; and
- said lasers being connected to direct light emitted by each laser to a common output facet to cause a beam of light having a wavelength corresponding to the wavelength emitted by an activated laser to be emitted from said common facet.

21. The wavelength selectable device of claim 20, wherein said plurality of lasers is coupled in series to said common output facet, each laser in said series being transparent to light beams from prior lasers.

22. The wavelength selectable device of claim 21, wherein said common output facet is the output facet of the last laser in said series of lasers.

23. The wavelength selectable device of claim 21, wherein said common output facet is an output facet of a light modulator coupled to said series of lasers.

24. The wavelength selectable device of claim 20, wherein said plurality of lasers is coupled in parallel to said common output facet.

25. The wavelength selectable device of claim 24, wherein said common output facet is an output facet of an output coupler having a plurality of inputs each coupled to a corresponding one of said plurality of lasers.

26. The device of claim 20, further including a coupler element for receiving light emitted by each of said laser ring cavities and for directing received light to said common output facet.

27. A wavelength selectable device, comprising:
- a first semiconductor ring cavity laser having a first output facet and being energizable to emit light of a first wavelength at said first output facet;
- at least a second semiconductor ring cavity laser having a second output facet, and being energizable to emit light of a second wavelength at said second output facet; and
- a coupler having at least first and second input facets coupled to said first and second laser output facets, respectively, and having at least an output facet, and
- means to selectively energize said first and second lasers to cause light having the wavelength of the selected laser to be emitted from said coupler output facet.

28. The device of claim 27, wherein said coupler includes multiple input facets, and further including multiple ring cavity lasers each having an output facet and each being energizable to emit a corresponding output light having a corresponding distinct wavelength, each laser output facet being coupled to a corresponding one of said multiple input facets.

29. The device of claim 27, wherein said coupler has multiple outlet facets.

30. The device of claim 27, further including a modulator coupled between each said ring laser output facet and a corresponding coupler input facet.

31. The device of claim 30, wherein said coupler has multiple outlet facets.

32. The device of claim 27, further including means to modulate said coupler.

33. The device of claim 27, wherein said coupler is an open ring element biased to propagate light received from either or both of said first and second lasers to said coupler output facet.

34. The device of claim 33, wherein said coupler element includes multiple coupler input facets, and further including multiple additional ring cavity lasers each having a corresponding output facet and each being energizable to emit light of a corresponding different wavelength at its output facet, each laser output being coupled to a corresponding one of said multiple coupler input facets.

35. The device of claim 34, further including a bias voltage selectably connectable to energize each said ring cavity laser.

36. The device of claim 34, wherein each of said ring cavity lasers has a different cavity length for producing said light of corresponding different wavelengths.

37. The device of claim 34, wherein each of said ring cavity lasers has a different active layer bandgap for producing said light if corresponding different wavelengths.

38. A photonic device comprising:
- at least one semiconductor ring cavity laser energizable to emit at a first output facet an output light beam having a frequency corresponding to the cavity length of the laser;
- a semiconductor optical modulator having an input facet directly coupled to said first output facet to receive said output light beam, and having a modulator output facet, said modulator being energizable to regulate the emission of said light beam at said modulator output facet;
- wherein said ring laser and said modulator are integrally fabricated on a semiconductor substrate; and
- wherein said ring laser and said modulator are quantum well devices, and wherein said modulator has a bandgap that is higher than the bandgap of said ring laser.

* * * * *